(12) United States Patent
Hachuda

(10) Patent No.: US 8,475,196 B2
(45) Date of Patent: Jul. 2, 2013

(54) UNLUBRICATED BEARING STRUCTURE AND IC SOCKET USING SAME

(75) Inventor: Osamu Hachuda, Saitama (JP)

(73) Assignee: Enplas Corporation, Saitama (JP)

( * ) Notice: Subject to any disclaimer, the term of this patent is extended or adjusted under 35 U.S.C. 154(b) by 74 days.

(21) Appl. No.: 13/226,581

(22) Filed: Sep. 7, 2011

(65) Prior Publication Data
US 2012/0064756 A1    Mar. 15, 2012

(30) Foreign Application Priority Data
Sep. 14, 2010 (JP) ............................... 2010-205082

(51) Int. Cl.
*H01R 13/62* (2006.01)

(52) U.S. Cl.
USPC .......................................... 439/331; 384/276

(58) Field of Classification Search
USPC .................. 439/331, 366; 384/154, 276, 275, 384/295, 901
See application file for complete search history.

(56) References Cited

U.S. PATENT DOCUMENTS

| | | | |
|---|---|---|---|
| 4,966,555 A * | 10/1990 | Zagorski | 439/28 |
| 5,601,370 A * | 2/1997 | Shibayama et al. | 384/215 |
| 6,468,096 B1 * | 10/2002 | Nagatsuka | 439/164 |
| 6,776,628 B2 * | 8/2004 | Foriska et al. | 439/92 |
| 6,851,988 B2 * | 2/2005 | Tiegel et al. | 439/754 |
| 7,290,334 B2 * | 11/2007 | Pettersen | 29/876 |
| 7,661,884 B2 * | 2/2010 | Jo | 384/277 |
| 8,118,492 B2 * | 2/2012 | Weiden et al. | 384/276 |
| 2006/0160434 A1 * | 7/2006 | Pettersen | 439/801 |
| 2008/0144983 A1 * | 6/2008 | Fedotov et al. | 384/275 |
| 2009/0180720 A1 * | 7/2009 | Weiden et al. | 384/276 |
| 2012/0064756 A1 * | 3/2012 | Hachuda | 439/366 |

FOREIGN PATENT DOCUMENTS

JP       62-242129       10/1987

* cited by examiner

*Primary Examiner* — James Harvey
(74) *Attorney, Agent, or Firm* — Staas & Halsey LLP

(57) ABSTRACT

An unlubricated bearing structure for supporting a rocking arm of an IC socket includes an arm support as an operating member that supports the rocking arm, a support shaft, made of metal, fitted and fixed to the arm support, and a cylindrical bush, made of metal, mounted to the support shaft so that the cylindrical bush is fitted into a bearing hole formed to the rocking arm. The support shaft, the cylindrical bush and the rocking arm are arranged such that a first clearance is formed between an outer peripheral surface of the support shaft and an inner peripheral surface of the cylindrical bush, and a second clearance is formed between an outer peripheral surface of the cylindrical bush and an inner peripheral surface of the bearing hole.

4 Claims, 10 Drawing Sheets

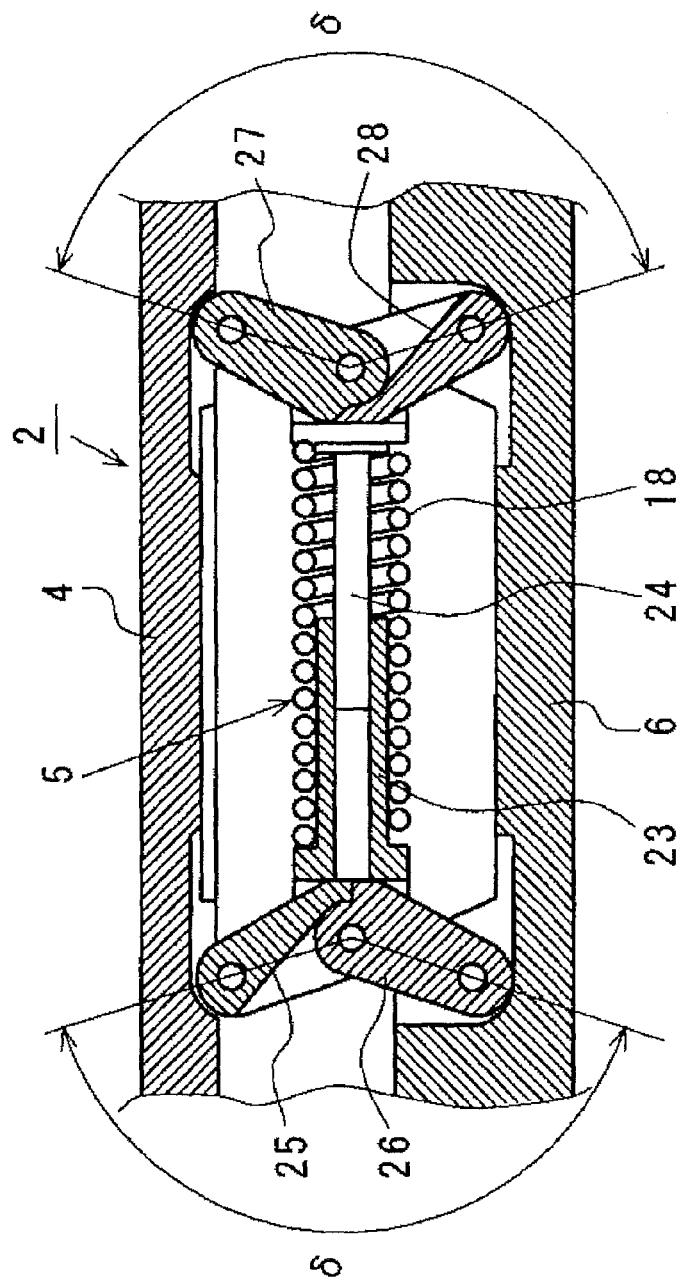

PRIOR ART the support shaft so that the cylindrical bush is fitted into the bearing hole of the rocking arm, wherein the support shaft, the cylindrical bush and the rocking arm are arranged such that a first clearance is formed between an outer peripheral surface of the support shaft and an inner peripheral surface of the cylindrical bush, and a second clearance is formed between an outer peripheral surface of the cylindrical bush and an inner peripheral surface of the bearing hole.

UNLUBRICATED BEARING STRUCTURE AND IC SOCKET USING SAME

BACKGROUND OF THE INVENTION

1. Field of the Invention

The present invention relates to an unlubricated bearing structure supporting a rocking arm to be swingable and to an IC socket using the same.

2. Related Art

FIG. 9 shows a conventional unlubricated bearing structure 100 of the type mentioned above. The unlubricated bearing structure 100 shown in FIG. 9 includes a bearing mount member 102 having an axial bearing hole 103, a cylindrical bush 101 which has an outer peripheral portion and which is pushed into the bearing hole 103, and a support shaft 104 which is fitted into the cylindrical bush 101 so that a clearance 105 exists between an inner peripheral portion of the cylindrical bush 101 and an outer peripheral portion of the support shaft 104 to thereby support the support shaft 104 to be rotatable by the bush 101 fixed to the bearing mount member 102 (refer to, for example, Japanese Patent Laid-open Publication No. SHO 62-242129, and JIS Machine Engineering Handbook (new edition), published on Mar. 15, 1968, pp. 8-319 to 8-324)

Such an unlubricated bearing structure 100 is applicable to be disposed between relatively rotatable two members of a device to which a lubricating agent (lubricant) is not usable (such as electrical testing device of an IC package requiring an insulating property).

However, such unlubricated bearing structure 100 has provided the following defects.

That is, as shown in FIGS. 10A and 10B, in which the conventional unlubricated bearing structure 100 is applied to a central portion of the rocking (swinging) motion of the rocking arm 106, and one end side of the rocking arm 106 corresponds to the bearing mount portion 102 shown in FIG. 9.

With the conventional bearing structure 100 shown in FIG. 10A and FIG. 10B, when a force F1 other than self-weight pressing the rocking arm 106 toward the center of rocking motion acts, the support shaft 104 made of metal (stainless steel) slidably contacts the cylindrical bush 101, also made of metal (stainless steel), which results in causing of problem of significant wearing of the support shaft 104 as represented by oblique lines in FIG. 10B and the rocking arm is hence hardly driven or operated smoothly and easily, thus being defective and disadvantageous.

SUMMARY OF THE INVENTION

The present invention was conceived in consideration of the above circumstances to solve the defects encountered in the conventional unlubricated bearing structure mentioned above and an object thereof is to provide an unlubricated bearing structure capable of effectively reducing wearing of a support shaft of the unlubricated bearing structure and providing smooth operation of a rocking arm thereof, and also provide an IC package equipped with such an improved unlubricated bearing structure.

This and other objects can be achieved according to the present invention by providing, in one aspect, an unlubricated bearing structure for supporting a rocking arm, having a bearing hole, to be rocked swingably, comprising: an arm support as an operating member that supports the rocking arm; a support shaft, made of metal, fitted and fixed to the arm support; and a cylindrical bush, made of metal, mounted to the support shaft so that the cylindrical bush is fitted into the bearing hole of the rocking arm, wherein the support shaft, the cylindrical bush and the rocking arm are arranged such that a first clearance is formed between an outer peripheral surface of the support shaft and an inner peripheral surface of the cylindrical bush, and a second clearance is formed between an outer peripheral surface of the cylindrical bush and an inner peripheral surface of the bearing hole.

The support shaft and the cylindrical bush may be both made of stainless steal.

According to the above aspect of the embodiment of the present invention, according to the rocking (swinging) motion of the rocking arm, sliding motions are caused between the outer peripheral surface of the support shaft and the inner peripheral surface of the bush, and also, between the outer peripheral surface of the bush and the inner peripheral surface of the bearing hole, thereby reducing wearing at the sliding contacting portion between the support shaft and the bush, and accordingly, the rocking arm in the present embodiment can be smoothly operated for a long period.

In another aspect of the present invention, there is also provided an IC socket, wherein the rocking arm is supported to be swingable through the unlubricated bearing structure of the characters mentioned above, and when the rocking arm is swung, an IC package placed on a floating plate is pushed toward the floating plate by means of push member.

More specifically in structure, there is provided an IC socket, comprising: a socket body; an arm support operatively connected to the socket body; a floating plate on which an IC package is placed; an IC package pressing mechanism including a rocking arm; and a pressing member mounted to the IC package pressing mechanism so as to press the IC package placed on the floating plate when the rocking arm is swung by means of an unlubricated bearing structure, wherein the unlubricated bearing structure of the characters mentioned above.

According to such IC socket provided with the improved unlubricated bearing structure, the IC socket can be smoothly operated for a long period.

The nature and further characteristic features of the present invention will be made clearer from the following descriptions made with reference to the accompanying drawings.

BRIEF DESCRIPTION OF THE DRAWINGS

In the accompanying drawings:

FIG. 1 shows an electrical testing device for an IC package to which an unlubricated bearing structure according to the present invention is applied, in which

FIG. 2 is a longitudinal cross-sectional view as a right side view in FIG. 1 and shows a first operating condition of an open/close support mechanism of the electrical testing device for the IC package;

FIG. 4 shows an unlubricated bearing structure according to the embodiment of the present invention, in which

5A is an illustration thereof

FIG. 6 shows a bush constituting the unlubricated bearing structure of the present embodiment, in which

FIG. 7 shows a conventional unlubricated bearing structure, as a comparative example, in which

FIG. 10 is an illustration showing operating states of a rocking arm of the conventional unlubricated bearing structure of FIG. 9, in which

DESCRIPTION OF THE PREFERRED EMBODIMENT

A preferred embodiment of the present invention will be described hereunder with reference to the accompanying drawings.

(Electrical Testing Device to which Unlubricated Bearing Structure is Applied)

Figure 3:
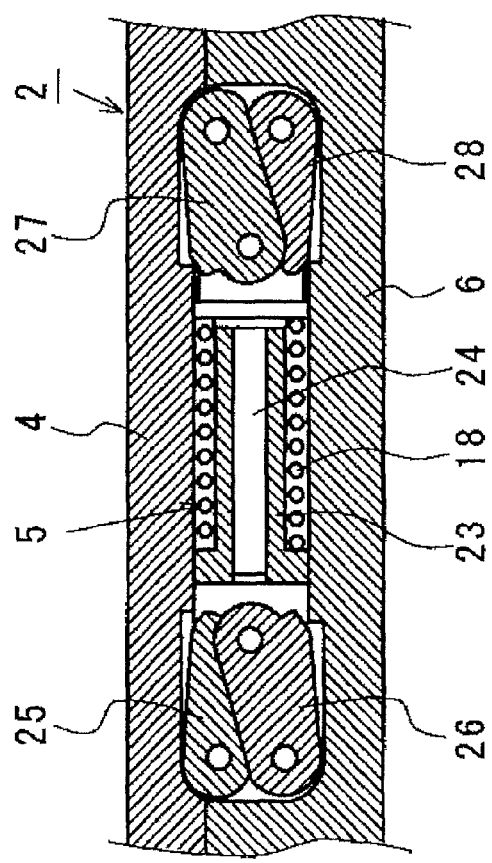
FIG. 3 is a longitudinal cross-sectional view as a right side view in FIG. 1 and shows a second operating condition of an open/close support mechanism of the electrical testing device for the IC package.

FIGS. 1 to 3 represent an electrical testing device for an IC package (i.e. IC socket) 2 to which an unlubricated bearing structure K according to an embodiment of the present invention is applied.

Figure 1A:
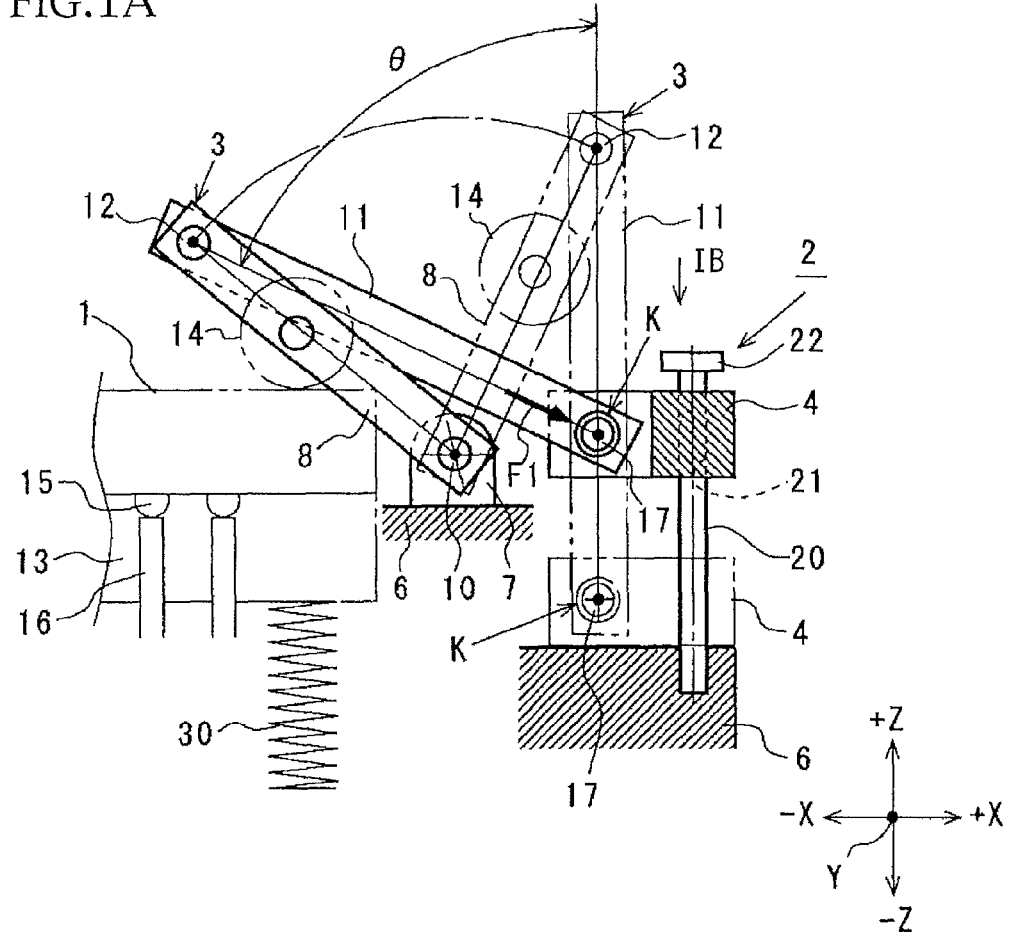
FIG. 1A is a pattern diagram schematically showing a portion of the electrical testing device for the IC package and FIG. 1B is a plan view shown from an arrowed direction IB in FIG. 1A.
Figure 1B:
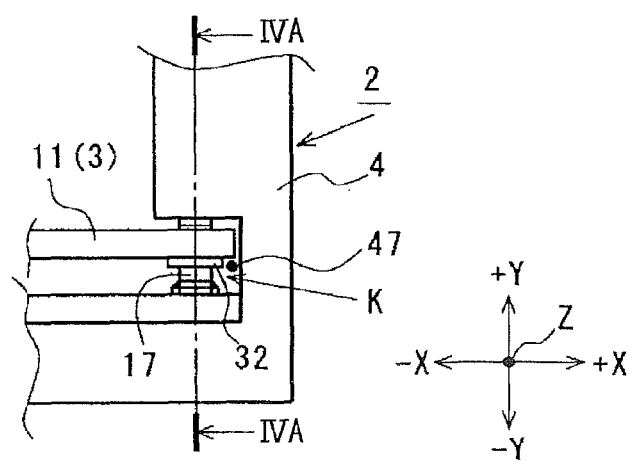

In the drawings, FIG. 1 is a view as a pattern diagram showing a portion (pressing mechanism 3 of the IC package) of the electrical testing device 2 for the IC package. FIG. 1B is a plan view showing an operating member 4 side of the IC package pressing mechanism 3 as viewed from an arrowed direction IB in FIG. 1A. FIG. 2 is a longitudinal cross-sectional view as a right side view in FIG. 1 and shows a first operating condition of an open/close support mechanism 5 of the electrical testing device 2 for the IC package 1. FIG. 3 shows a second operating condition of an open/close support mechanism 5 of the electrical testing device 2 for the IC package 1.

As shown in these FIGS. 1 to 3, the operating member (arm support member) 4 is mounted to a socket body (device body) 6 of an IC socket through an IC package pressing mechanism 3 and the open/close support mechanism 5 to be vertically movable (reciprocally movable in ∓ Z direction). The operating member 4 is formed with a shaft hole 37 described hereinafter.

The socket body 6 of an IC socket includes an arm mount member 7 to which one end of a first arm 8 constituting the IC package pressing mechanism 3 is mounted to be swingable (pivotal) by means of support pin 10 (FIG. 1).

Further, one end of a second arm (rocking arm) constituting the IC package pressing mechanism 3 together with the first arm 8 is supported to the operating member 4 so as to be swingable (pivotal) by the unlubricated bearing structure K. The other end of the first arm 8 and the other end of the second arm 11 are coupled with each other to be relatively rotatable by means of coupling pin 12 (FIGS. 1A and 1B).

A pushing member 14 for pushing the IC package 1 toward a floating plate 13 disposed inside the socket body 6 of an IC socket is mounted to an intermediate portion in the longitudinal direction of the first arm 8.

The pushing member 14 abuts against the IC package 1 at a closing position (portion shown with solid lines in FIGS. 1A and 1B) of the IC package pushing mechanism 3 so as to press the IC package 1 toward the flowing plate 13 to thereby push a terminal 15 of the IC package 1 against a contact pin accommodated in the floating plate 13, whereby the IC package 1 and an external electrical testing circuit, not shown, can be electrically contacted to each other through the contact pin 16.

On the other hand, in an opening position (standing position shown with two-dot-chain lines in FIG. 1A) of the IC package pushing mechanism 3, the pushing member 14 is completely separated from the IC package 1 and the pushing member 14 to thereby retire from the operation space of the IC package 1. Accordingly, at a time when it is required for the IC package 1 to be taken out from the surface of the floating plate 13 outside the electrical testing device 2, the pushing member 14 does not encumber the movement of the IC package 1 (movement toward +Z direction in FIG. 1A). Furthermore, at a time when the IC package 1 is newly set on the floating plate 13, the pushing member 14 does not encumber the movement of the IC package 1 (movement toward −Z direction in FIG. 1A).

The second arm 11 serves as a center axis for rocking motion of a support shaft or pin 17 constituting the unlubricated bearing structure K, and the second arm 11 has one end which is connected to the operating member 4 through the support shaft 17 and this one end vertically moves in accordance with the vertical movement of the operating member 4, and rocks (swings) by an rocking angle θ with the support shaft 17 being the rocking center axis in a range from the closing position of the first arm 8 (position shown with solid line in FIG. 1A) to the opening position thereof (standing position shown with two-dot-chain line in FIG. 1A).

The operating member 4 is always urged upward (i.e., direction apart from the socket body 6 (+Z direction in FIG. 1A), as shown in FIG. 2, by a spring force of a compression coil spring 18 of a control mechanism 5 for controlling or maintaining the opening/closing operation (called open/close controlling mechanism 5, hereinlater), and at the position shown with the solid line in FIG. 1A, the open/close controlling mechanism 5 maintains the IC package pressing mechanism 3 to the closing position.

Furthermore, when the operating member 4 is pushed downward from the position shown with the solid line in FIG. 1A to the position abutting against the socket body 6 (position shown with two-dot-chain line in FIG. 1A), the operating member 4 serves to change the attitude of the IC package controlling mechanism 3 from the closing position to the opening position.

The operating member 4 is formed with a guide hole 21 fitted with a guide rod 20 fixed to the socket body 6 so as to be vertically movable along the guide rod, and the upper end position of the operating member 4 is limited by a head portion 22 of the guide rod 20.

As shown in FIGS. 2 and 3, the open/close controlling mechanism comprises: a cylinder 23 having a cylinder bore; a rod 24 to be fitted in or out of the cylinder bore; a compression coil spring 18 always urging the rod 24 in a direction along which the rod 24 is pulled out from the cylinder bore; a first link member 25 connecting one end of the cylinder 23 to the operating member 4; a second link member connecting one end of the cylinder 23 to the socket body 6; a third link member 27 connecting one end of the rod to the operating member 4; and a fourth link member 28 connecting the one end of the rod 23 to the socket body 6.

The open/close controlling mechanism 5 is constituted as a toggle mechanism, and as an opening (opened) angle δ between the first link member 25 and the second link member 26 and an opening (opened) angle δ0 between the third link member 27 and the second link member 28 become large, the force (spring force) urging the operating member 4 upward (direction apart from the socket body; i.e., +Z direction in FIG. 1A) becomes large. As a result, the pushing member of the IC package pushing mechanism 3 can press the IC package 1 with a large force toward the floating plate 13 in comparison with a case in which the operating member 4 is directly urged upward only by the compression coil spring.

The floating plate 13 is elastically supported by a plate supporting spring 30. After the abutment of the pushing member 14 against the IC package 1 placed on the floating plate 13, the floating plate 13 compresses downward the plate supporting spring 30 so as to press downward the floating plate 13 and the IC package 1 by a predetermined distance (i.e., distance abutting against a stopper, not shown). According to such motion, the second arm 11 of the IC package pressing mechanism 3 is rocked by an angle θ from the opening position to the closing position thereof, and the terminal 15 of the IC package 1 surely contacts the contact pin 16 accommodated in the floating plate 13.

When the floating plate 13 moves downward by the predetermined distance, although a force D1 acting on the support shaft 17 as a rocking motion center axis rapidly increases, since the second arm 11 is supported to be swingable by the unlubricated bearing structure K, the second arm 11 can be smoothly rocked (swung) between the opening position and the closing position.

(Unlubricated Bearing Structure)

Figure 4A:
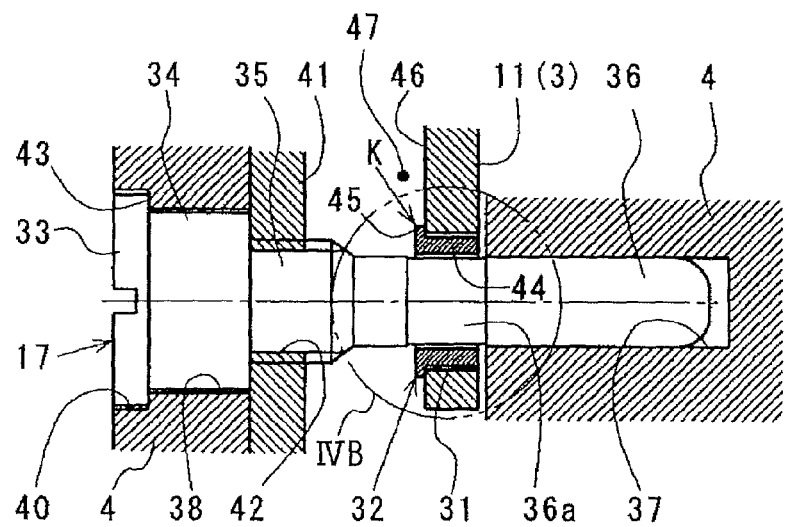
FIG. 4A is a sectional structure thereof taken along the line IVA-IVA in FIG. 1B.
Figure 4C:
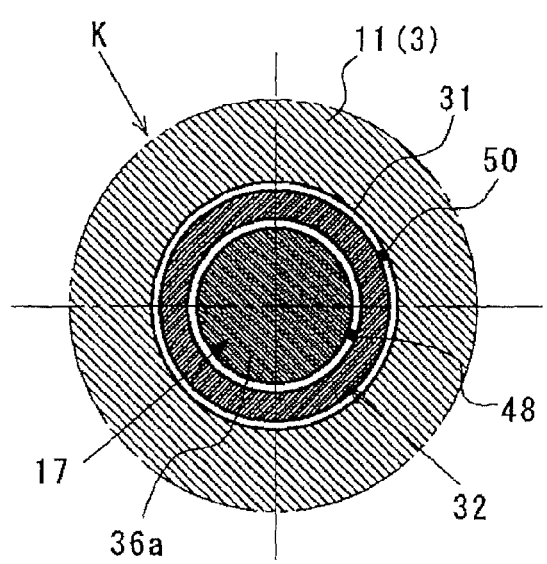
FIG. 4C is a sectional view taken along the line IVC-IVC in FIG. 4B.
Figure 4B:
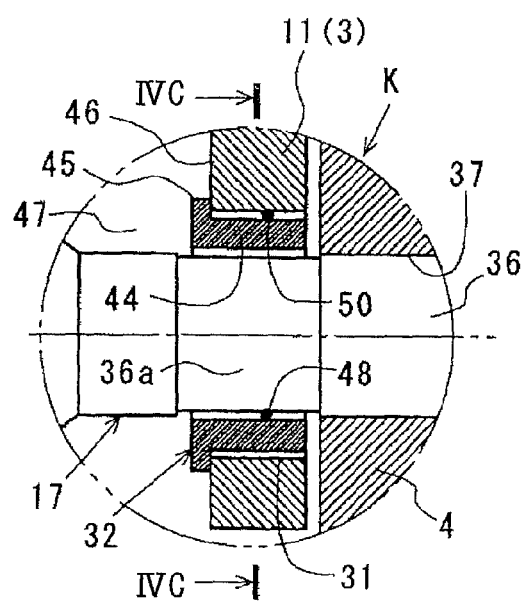
FIG. 4B is an enlarged view of a encircled portion IVB of FIG. 4A.

FIG. 4 (FIGS. 4A to 4C) represents the unlubricated bearing structure K according to the present embodiment, in which FIG. 4A is a sectional structure thereof taken along the line IVA-IVA in FIG. 1B, FIG. 4B is an enlarged view of an encircled portion IVB of FIG. 4A and FIG. 4C is a sectional view taken along the line IVC-IVC in FIG. 4B.

As shown in FIGS. 4A to 4C, the unlubricated bearing structure K of the present embodiment includes: the support shaft 17, made of metal such as stainless steel (SUS303, 304 and like), fixed to the operating member 4; and a cylindrical bush 32, made of metal such as stainless steel (SUS 303, 304 or like), interposed between the outer peripheral surface of the support shaft 17 and the inner peripheral surface of the bearing hole 31 of the second arm 11.

Figure 5A:
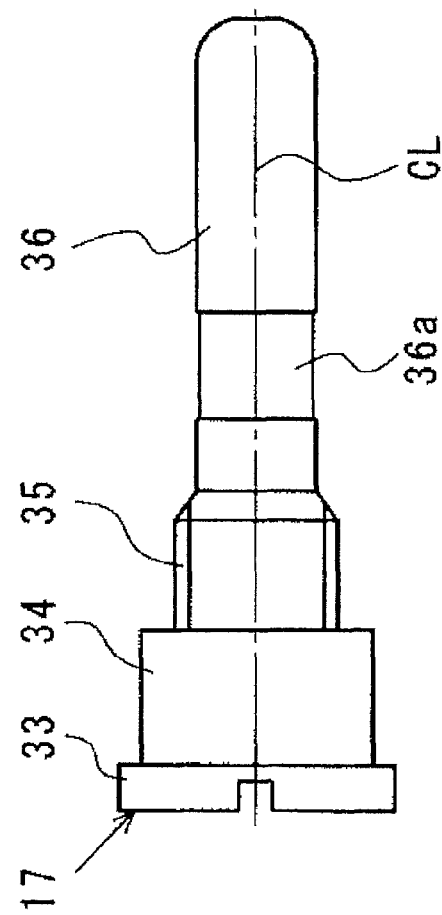
FIG. 5 shows a support shaft constituting the unlubricated bearing structure of the present embodiment, in which FIG.
FIG. 5B is a left side view of the support shaft shown in FIG. 5A.
Figure 5B:
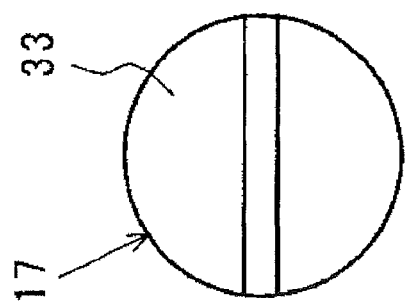

The support shaft 17 is composed of a first head portion 33 having a largest outer diameter, a second head portion 34 having a diameter smaller than that of the first head portion 33, a screw (threaded) portion 35 having a diameter further smaller that that of the second head portion 34, and a shank portion 36 having a diameter further smaller than that of the screw portion 35, the first head portion 33, the second head portion 34, the screw portion 35 and the shank portion 36 being formed along an axis CL, in this order, of the support shaft 17 as shown in FIGS. 5A and 5B.

The support shaft 17 is fixedly engaged with the operating member 4 (i.e., shaft support member) in a manner such that the front (top) end side of the shank portion 36 is first fitted into the shaft hole 37 formed in the operating member 4, the second head portion 34 is fitted into a second head portion engaging hole 38, the first head portion 33 is fitted into a first head portion engaging hole 40 formed in the operating member 4, and the screw (threaded) portion 35 is screwed into a screw hole 42 of a metal reinforcing member 41 integrally formed with the operating member 4. According to the manner mentioned above, the support shaft 17 is fixed to the operating member 4. Further, the support shaft 17 is positioned with respect to the operating member 4 by seating the first head portion 33 on a bottom surface (bottom seat portion) 43 of the first head portion engaging hole 40.

Figure 6A:
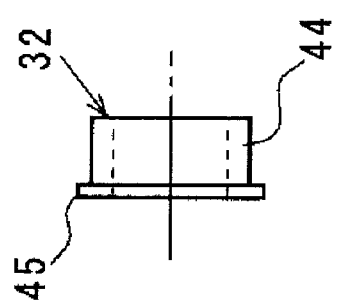
FIG. 6A is a front view thereof and FIG. 6B is a left side view of the bush of FIG. 6A.
Figure 6B:
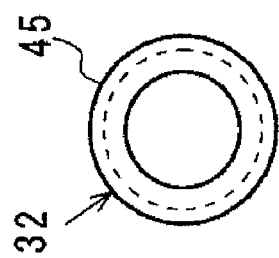

The bush 32 has a cylindrical portion 44 and a flanged portion (flange) 45 integrally formed to one end thereof so as to extend outward therefrom as shown in FIGS. 6A and 6B. In an assembling operation, the cylindrical portion 44 of the bush 32 is fitted in a space between the shank portion 36 of the support shaft 17 (i.e., a bearing engaging shank portion 36a) and the bearing hole 31 of the second arm 11 in a manner such that the flanged portion 45 of the bush 32 abuts against the side surface 46 of the second arm 11. In this state, the bearing engaging shank portion 36a of the support shaft 17 is positioned inside an arm mounting groove 47 formed to the operating member 4, and one end side of the second arm 11 is accommodated inside the arm mounting groove 47 of the operating member 4 so as to be swingably supported by the bearing engaging shank portion 36a through the bush 32.

As clearly shown in FIG. 4B, the cylindrical portion 44 of the bush 32 is formed with a first clearance (first engaging clearance or gap) 48, when fitted into the bearing engaging shank portion 36a, between the inner peripheral surface of the cylindrical portion 44 and the outer peripheral surface of the bearing engaging shank portion 36a, and a second clearance (second engaging clearance or gap) 50, when fitted into the bearing engaging shank portion 36a, between the outer peripheral surface of the cylindrical portion 44 and the inner peripheral surface of the bearing hole 31 of the second arm 11. Any lubricant such as grease or like does not fill up the first and second engaging clearances 48 and 50.

With the unlubricated bearing structure K of the present embodiment of the structure mentioned above, there causes a sliding motion between the outer peripheral surface of the bearing engaging shank portion 36a of the support shaft 17 and the inner peripheral surface of the bush 32 in accordance with the rocking (swinging) motion of the second arm 11, and on the other hand, there causes sliding motion between the outer peripheral surface of the bush 32 and the inner peripheral surface of the bearing hole 31 of the second arm 11 in accordance with the rocking (swinging) motion of the second arm 11. That is, according to the unlubricated bearing structure K of the present embodiment, when the second arm 11 is rocked, there causes two sliding contact portions.

Figure 9:
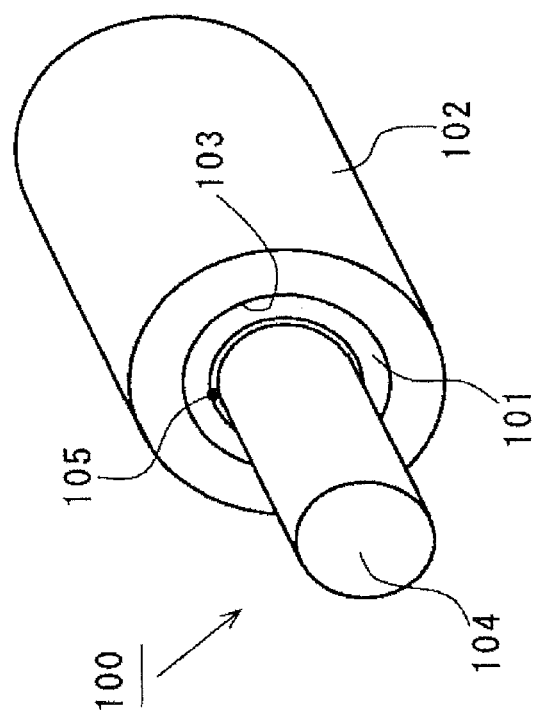
FIG. 9 is a perspective view of a conventional unlubricated bearing structure.
Figure 10A:
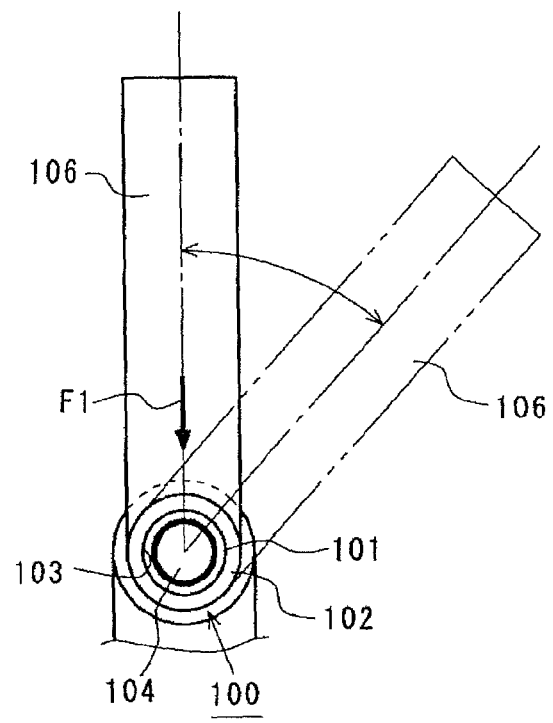
FIG. 10A is a view showing a state of supporting a rocking arm by the conventional unlubricated bearing structure to be swingable and FIG. 10B is an enlarged view of an essential portion of FIG. 10A.
Figure 10B:
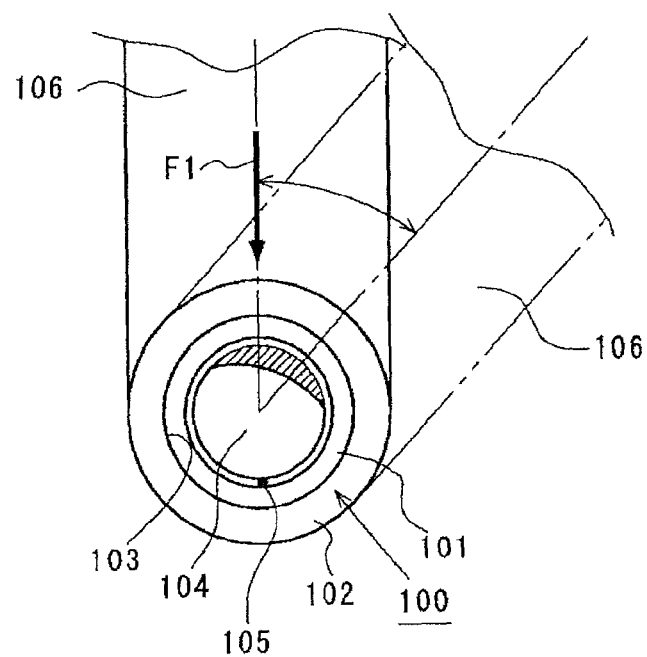

On the contrary, according to the unlubricated bearing structure 100 (FIGS. 9 and 10) of the conventional structure, the sliding contacting are caused at only one portion between the support shaft 104 and the bush 101.

As a result, according to the unlubricated bearing structure K of the present embodiment, wearing between the bush 32 of the support shaft 17 and the sliding contact portion can be effectively reduced in comparison with the conventional structure, and the second arm 11 can be more smoothly operated for a long term than the conventional structure.

(Wearing Test of Unlubricated Bearing Structure)

Figure 7A:
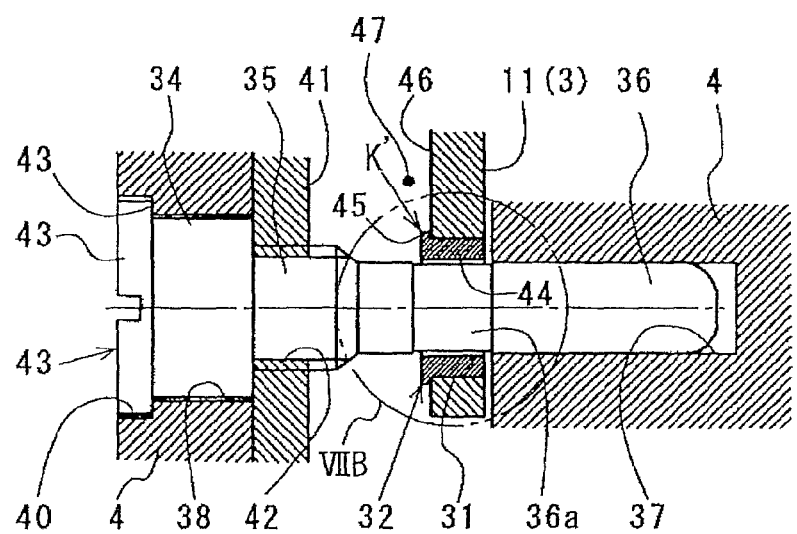
FIG. 7A is a view illustrating a structure corresponding to FIG. 4A.
Figure 7C:
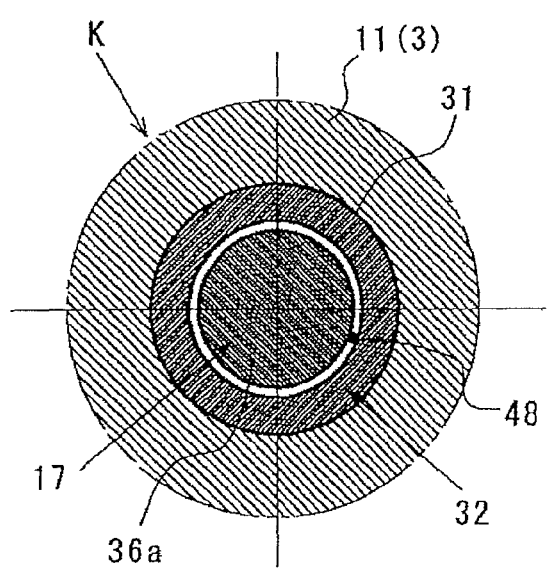
FIG. 7C is a view illustrating a structure corresponding to FIG. 4C.
Figure 7B:
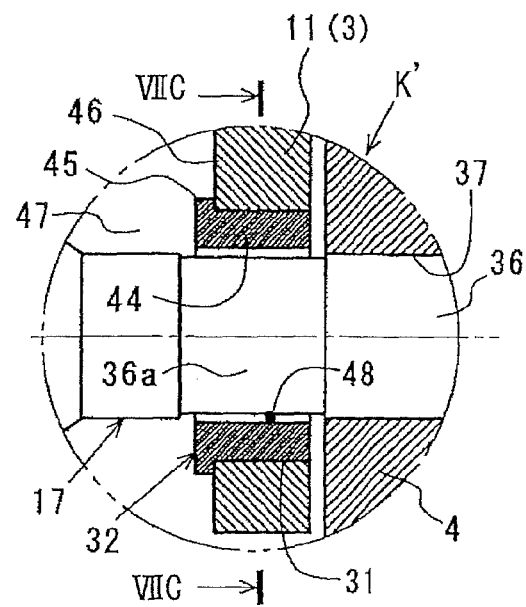
FIG. 7B is a view illustrating a structure corresponding to FIG. 4B
Figure 8:
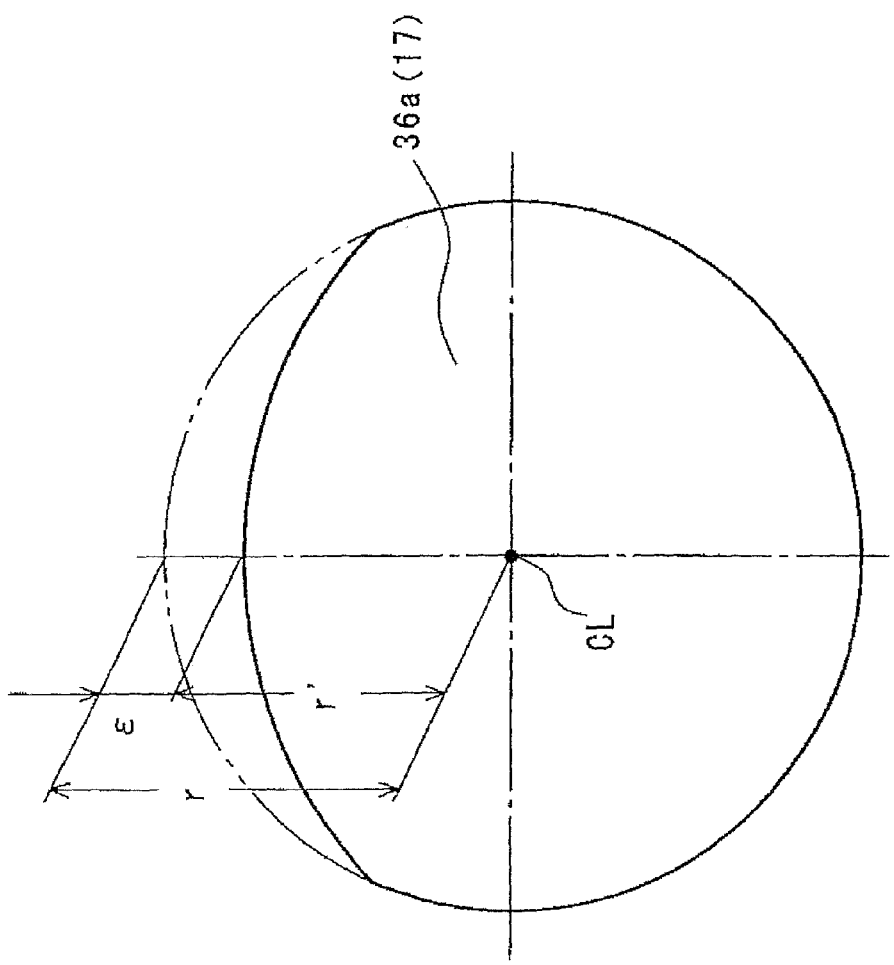
FIG. 8 is a pattern diagram showing a wearing condition of the support shaft.

FIG. 7 (FIGS. 7A to 7C) shows a conventional unlubricated bearing structure (called "Comparative Example" for the sake of convenience) for the purpose of comparison with the unlubricated bearing structure K (FIGS. 4A to 4C) according to the present embodiment, in which FIGS. 7A to 7C corresponds to FIGS. 4A to 4C, and like reference numerals are added to members or portions of the unlubricated bearing structure K' of the comparative example corresponding to those of the present embodiment (FIG. 4) and duplicated descriptions thereof are omitted herein.

The unlubricated bearing structure K' of the comparative example is also provided with the bush 32 which is fitted into the bearing hole 31 of the second arm 11 and fixed thereto with no clearance so that only the first engaging clearance 48 is formed between the inner peripheral surface of the bush 32 and the bearing engaging shank portion 36a of the support shaft 17.

Wearing experiment (test) was conducted to the support shaft 17 (i.e., bearing engaging portion 36a) under the condition such that the unlubricated bearing structure K according to the present embodiment shown in FIGS. 4A, 4B and 4C and the unlubricated bearing structure K' according to the Comparative Example by using the electrical testing device 2 shown in FIGS. 1A and 1B. Further, materials for the second arm 11, the bush 32 and the support shaft 17 used in this wearing experiment are as follows (Table 1).

TABLE 1

|  | Second Arm | Bush | Support Shaft |
| --- | --- | --- | --- |
| Material | SUS 304 | SUS 420J2 | SUS 420J2 |
| Hardness | 10 | 18 | 18 |
| Friction Coefficient | 0.5-0.6 | 0.5-0.6 | 0.5-0.6 |
| Surface Roughness (Sliding Contact Surface) | Ra 6.3 | Ra 1.6 | Ra 1.6 |

\* Surface Roughness is a mathematical average roughness (Ra).

The dimensions or sizes of the unlubricated bearing structure K according to the present embodiment and the unlubricated bearing structure K' according to the Comparative Example are shown in the following Table 2.

TABLE 2

|  | Present Embodiment | Comparative Example |
| --- | --- | --- |
| Diameter d (mm) of Bearing Engaging Shank Portion of Support Shaft | 2.42 | 2.42 |
| Inner Diameter D (mm) of Bearing Hole of Second Arm | 3.5 | 3.5 |
| First Fitting Clearance (μm) | 5.5 | 5.5 |
| Second Fitting Clearance (μm) | 5 | 0 |
| Slidable Contact Length (mm) in Axial Direction Between Bush and Bearing Engaging Shaft Portion | 1.7 | 1.7 |
| Slidable Contact Length (mm) in Axial Direction Between Bush and Bearing Hole | 1.2 | 1.2 |

The wearing experiment (test) was performed to the unlubricated bearing structure K according to the present embodiment and the unlubricated bearing structure K' according to the Comparative Example under the conditions shown in the following Table 3.

TABLE 3

|  | Present Embodiment | Comparative Example |
| --- | --- | --- |
| Second Arm Rocking Angle (θ°) | 90 | 90 |
| Maximum Bearing Load (F1 (N)) | 637 | 637 |
| Second Arm Rocking Speed (deg/s) | 225 | 225 |
| Number of Second Arm Rocking Motion | 20000 | 20000 |

The following Table 4 shows result (as wearing amounts $\epsilon$ (μm)) of the wearing experiment to the support shaft 17 of the unlubricated bearing structure K according to the present embodiment with respect to the wearing experiment to the support shaft 17 of the unlubricated bearing structure K' according to the Comparative Example.

In the wearing experiments mentioned above, the wearing amount $\epsilon$ (μm) of the support shaft 17 is expressed as the maximum value of the difference (r–r') in which r is a dimension in a radial direction of the outer surface of the bearing engaging portion 36a of the support shaft 17 before the wearing experiment and r' is a dimension in a radial direction of the worn outer surface of the bearing engaging portion 36a of the support shaft 17 after the wearing experiment.

TABLE 4

|  | Present Embodiment | Comparative Example |
| --- | --- | --- |
| Wearing Amount (μm) | 13 | 258 |

As described hereinabove, it is found that, according to the unlubricated bearing structure K of the present embodiment, the wearing amount $\epsilon$ (μm) of the support shaft 17 can be made smaller than that of the unlubricated bearing structure K' of the Comparative Example (conventional example). Accordingly, the electrical test device 2, in which the unlubricated bearing structure K of the present embodiment is provided to the rocking motion center portion of the second arm 11 can maintain the smooth rocking motion for a long period, thus being advantageously available.

(Other Examples of Unlubricated Bearing Structure According to Present Embodiment)

It is further to be noted that the unlubricated bearing structure K according to the present embodiment is not limited to the use to be located in the rocking motion center portion of the electrical testing device 2, and may be widely usable for supporting rocking arms, to be rocked (swingable), of various machines or devices to which lubricants (lubricating agents) are not usable.

For example, according to an IC socket provided with the unlubricated bearing structure K of the structures and characters mentioned above, there is obtainable an IC socket smoothly operated for a long period.

What is claimed is:

1. An unlubricated bearing structure for supporting a rocking arm, having a bearing hole, to be rocked swingably, comprising:
    an arm support that supports the rocking arm;
    a support shaft, made of metal, fitted and fixed to the arm support; and
    a cylindrical bush, made of metal, mounted to the support shaft so that the cylindrical bush is fitted into the bearing hole of the rocking arm,
    wherein the support shaft, the cylindrical bush and the rocking arm are arranged such that a first clearance is formed between an outer peripheral surface of the support shaft and an inner peripheral surface of the cylindrical bush, and a second clearance is formed between an outer peripheral surface of the cylindrical bush and an inner peripheral surface of the bearing hole.

2. The unlubricated bearing structure according to claim 1, wherein the support shaft and the cylindrical bush are both made of stainless steal.

3. An IC socket, wherein the rocking arm is supported to be swingable through the unlubricated bearing structure according to claim 1, and when the rocking arm is swung, an IC package placed on a floating plate is pushed toward the floating plate by means of push member.

4. An IC socket, comprising:
a socket body;
an arm support operatively connected to the socket body;
a floating plate on which an IC package is placed;
an IC package pressing mechanism including a rocking arm; and
a pressing member mounted to the IC package pressing mechanism so as to press the IC package placed on the floating plate when the rocking arm is swung by means of an unlubricated bearing structure,
wherein the unlubricated bearing structure for supporting the rocking arm, having a bearing hole, comprises: an arm support that supports the rocking arm; a support shaft, made of metal, fitted and fixed to the arm support; and a cylindrical bush, made of metal, mounted to the support shaft so that the cylindrical bush is fitted into the bearing hole of the rocking arm, in which the support shaft, the cylindrical bush and the rocking arm are arranged such that a first clearance is formed between an outer peripheral surface of the support shaft and an inner peripheral surface of the cylindrical bush, and a second clearance is formed between an outer peripheral surface of the cylindrical bush and an inner peripheral surface of the bearing hole.

\* \* \* \* \*

UNITED STATES PATENT AND TRADEMARK OFFICE
CERTIFICATE OF CORRECTION

PATENT NO.       : 8,475,196 B2
APPLICATION NO.  : 13/226581
DATED            : July 2, 2013
INVENTOR(S)      : Osamu Hachuda It is certified that error appears in the above-identified patent and that said Letters Patent is hereby corrected as shown below:

In the Claims

Column 8, Line 62, In Claim 2, delete "steal." and insert -- steel. --, therefor.

Signed and Sealed this
Eighth Day of October, 2013

Teresa Stanek Rea
*Deputy Director of the United States Patent and Trademark Office*